(12) United States Patent
Lee (10) Patent No.: US 10,411,029 B2
(45) Date of Patent: Sep. 10, 2019

(54) SEMICONDUCTOR DEVICE AND METHOD OF MANUFACTURING THE SAME

(71) Applicant: SK hynix Inc., Gyeonggi-do (KR)

(72) Inventor: Nam Jae Lee, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/994,575

(22) Filed: May 31, 2018

(65) Prior Publication Data

US 2018/0277558 A1 Sep. 27, 2018

Related U.S. Application Data

(63) Continuation of application No. 15/723,260, filed on Oct. 3, 2017, now Pat. No. 10,014,313.

(30) Foreign Application Priority Data

Mar. 23, 2017 (KR) ........................ 10-2017-0036799

(51) Int. Cl.
*H01L 27/11568* (2017.01)
*H01L 27/11582* (2017.01)
*H01L 27/11575* (2017.01)

(52) U.S. Cl.
CPC .. *H01L 27/11568* (2013.01); *H01L 27/11575* (2013.01); *H01L 27/11582* (2013.01)

(58) Field of Classification Search
None
See application file for complete search history.

(56) References Cited

U.S. PATENT DOCUMENTS

| 2005/0169639 | A1* | 8/2005 | Shen ................. G02B 6/4212 398/164 |
| 2010/0213526 | A1* | 8/2010 | Wada ............... H01L 21/76808 257/314 |
| 2013/0062683 | A1* | 3/2013 | Fukuzumi ......... H01L 29/66833 257/324 |

FOREIGN PATENT DOCUMENTS

KR     1020150116681     * 10/2015

* cited by examiner

*Primary Examiner* — Mounir S Amer
(74) *Attorney, Agent, or Firm* — IP & T Group LLP (57) ABSTRACT

Provided herein is a semiconductor device. The semiconductor device may include conductive layers each including a line, and a pad which is coupled with the line and has a thickness greater than that of the line, the conductive layers being stacked such that the pads are exposed; insulating layers interposed between the conductive layers; first spacers each of which is interposed between the pad of the corresponding upper conductive layer and the pad of the corresponding low conductive layer; and second spacers covering the respective first spacers.

16 Claims, 8 Drawing Sheets

SEMICONDUCTOR DEVICE AND METHOD OF MANUFACTURING THE SAME

CROSS-REFERENCE TO RELATED APPLICATION

This application is a continuation of U.S. patent application Ser. No. 15/723,260 filed on Oct. 3, 2017, which claims priority under 35 U.S.C. § 119(a) to Korean patent application number 10-2017-0036799 filed on Mar. 23, 2017 in the Korean Intellectual Property Office. The disclosure of each of the foregoing applications is incorporated herein by reference.

BACKGROUND

Field of Invention

Various embodiments of the present disclosure generally relate to an electronic device, and more particularly, to a semiconductor device and a method of manufacturing the same.

Description of Related Art

Non-volatile memory devices retain stored data regardless of power on/off conditions. Recently, as a two-dimensional non-volatile memory device including memory cells formed on a substrate in a single layer reaches the limits of the integration improvement, a three-dimensional (3D) non-volatile memory device including memory cells stacked in a vertical direction on a substrate has been proposed.

A three-dimensional non-volatile memory device may include interlayer insulating layers and gate electrodes that are stacked alternately with each other, and channel layers passing the interlayer insulating layers and gate electrodes. Memory cells are stacked along the channel layers. To improve the operational reliability of such a non-volatile memory device having a three-dimensional structure, various structures and manufacturing methods have been developed.

SUMMARY

Various embodiments of the present disclosure are directed to a semiconductor device having stable structure and improved characteristics, of which the manufacturing process is facilitated, and a method of manufacturing the same.

An embodiment of the present disclosure may provide for a semiconductor device including: conductive layers each including a line, and a pad, which is coupled with the line and has a thickness greater than a thickness of the line, the conductive layers being stacked such that the pads are exposed; insulating layers interposed between the respective conductive layers; first spacers each interposed between a pad of an upper conductive layer and a pad of a lower conductive layer; and second spacers covering the respective first spacers.

An embodiment of the present disclosure may provide for a semiconductor device including: conductive layers each including a line, and a pad, which is coupled with the line and has a thickness greater than a thickness of the line, the conductive layers being stacked such that the pads are exposed; insulating layers interposed between the conductive layers, each of the insulating layers having a shape, an end of which is bent upward to cover a pad of an upper conductive layer; and contact plugs coupled with the respective pads of the conductive layers.

An embodiment of the present disclosure may provide for a method of manufacturing a semiconductor device, including: forming a stack including first material layers and second material layers that are alternately stacked in a stepped structure; forming first spacers on sidewalls of the first and second material layers exposed in the stepped structure; forming a third material layer on the stack formed with the first spacers; forming openings by selectively etching the first material layers so that the third material layer is exposed through the openings; forming second spacers by selectively etching the third material layer exposed through the openings, wherein the second spacers cover the respective first spacers; and forming conductive layers in the openings.

An embodiment of the present disclosure may provide for a method of manufacturing a semiconductor device, including: forming a stack including first material layers stacked in a stepped structure, and second material layers interposed between the first material layers, each of the second material layers having a shape, an end of which is bent upward to cover a part of a sidewall of an upper first material layer; forming a third material layer on the stack; forming openings by selectively etching the first material layers so that the third material layer is exposed through the openings; forming spacers by selectively etching the third material layer exposed through the openings, each of the spacers covering the end of the corresponding second material layer; and forming conductive layers in the openings.

DETAILED DESCRIPTION

Hereinafter, various embodiments will be described in detail with reference to the accompanying drawings; however, the embodiments may be described in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, various embodiments of the present invention will be described with reference to the accompanying drawings. The various embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, the described embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Figure 1A:
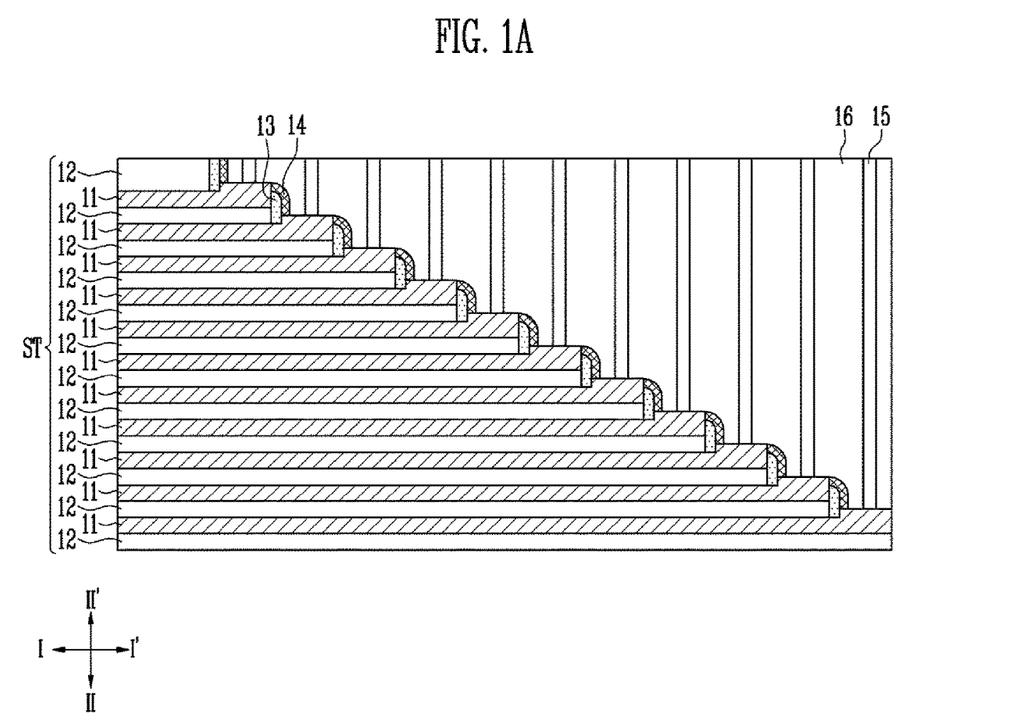
FIGS. 1A and 1B are sectional views illustrating a structure of a semiconductor device according to an embodiment of the present disclosure.
Figure 1B:
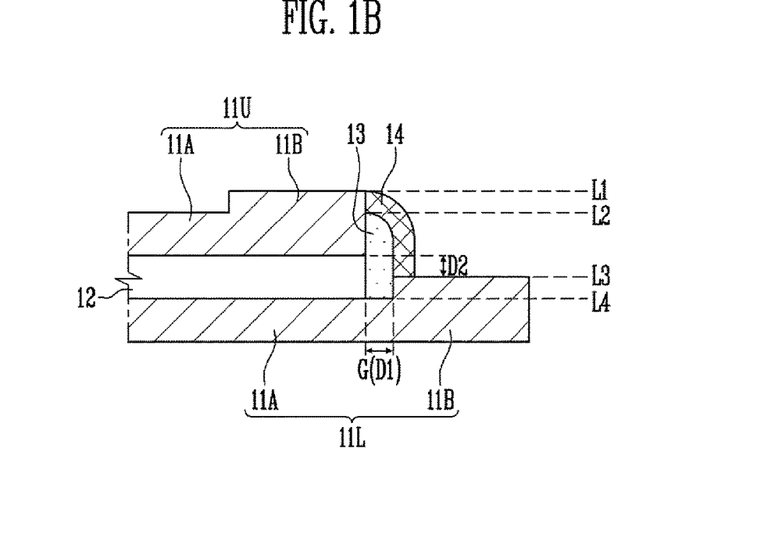

FIGS. 1A and 1B are sectional views illustrating a structure of a semiconductor device according to an embodiment of the present disclosure.

Referring to FIGS. 1A and 1B, the semiconductor device may include a stack ST, first spacers 13, and second spacers 14. In addition, the semiconductor device may further include contact plugs 15 coupled with respective conductive layers 11.

The stack ST includes the conductive layers 11 and insulating layers 12 that are alternately stacked. The conductive layers 11 and the insulating layers 12 may extend in a first direction I-I' and may be stacked in a second direction II-II'. The first direction I-I' may be a horizontal direction parallel to a surface of a substrate (not shown) located under the stack ST. The second direction II-II' may be a vertical direction or a stacking direction.

In addition, the stack ST may include a cell region in which memory cells are stacked, and a contact region in which an interconnection structure such as a line, a pad, and a contact plug is disposed. For example, the stack ST may include a channel structure passing through the cell region. The channel structure may include a channel layer and a memory layer enclosing a sidewall of the channel layer. The memory layer may include a tunnel insulating layer, a data storing layer, and a charge blocking layer. The data storing layer may include a floating gate formed of material such as silicon, charge trap material such as a nitride, phase change material, nanodots, and so forth.

Each of the conductive layers 11 may include a line 11A and a pad 11B, which is electrically coupled with the line 11A. For instance, the conductive layers 11 include metal such as tungsten. The pad 11B has a thickness greater than that of the line 11A. The conductive layers 11 are stacked in a stepped form such that the pads 11B are exposed. Therefore, the stack ST has a stepped structure.

The insulating layers 12 may be interposed between the stacked conductive layers 11, and include an insulating material such as an oxide material or a nitride material. Each of the insulating layers 12 is disposed to cover the line 11A of a corresponding lower conductive layer 11L. For instance, each of the insulating layers 12 and the pad 11B of the corresponding lower conductive layer 11L may be disposed at positions spaced apart from each other by a predetermined distance. In other words, the sidewall of the respective insulating layers 12 may be spaced apart from the sidewall of the pad 11B of the lower conductive layer 11L by a first distance D1 in the first direction I-I'. The first direction I-I' is illustrated as a horizontal direction in the figures.

Each of the first spacers 13 is interposed between the pad 11B of a corresponding upper conductive layer 11U and the pad 11B of the corresponding lower conductive layer 11L. As an embodiment, each of the first spacers 13 may cover the sidewall of the corresponding insulating layer 12. A gap G having the first distance D1 is present between each of the insulating layers 12 and the pad 11B of the corresponding lower conductive layer 11L. The gaps G may be filled with the respective first spacers 13. Therefore, the sidewall of each of the insulating layers 12 may be spaced apart from the sidewall of the pad 11B of the corresponding lower conductive layer 11L by the thickness (i.e. D1) of the first spacer 13 in the first direction I-I'.

As an another embodiment, an upper surface of each of the first spacers 13 may be disposed at a level L2 lower than a level L1 of an upper surface of the pad 11B of the corresponding upper conductive layer 11U and higher than a level L3 of an upper surface of the pad 11B of the corresponding lower conductive layer 11L (L3<L2<L1). In this case, the sidewall of the pad 11B of the upper conductive layer 11U may not be completely covered by the corresponding first spacer 13. For example, the first spacer 13 may have a height suitable for covering a portion of the sidewall of the pad 11B of the upper conductive layer 11U.

The second spacers 14 are disposed on the stepped structure of the stack ST. The second spacers 14 are formed to cover the respective first spacers 13. In the case where each of the first spacers 13 exposes an upper portion of the sidewall of the pad 11B of the corresponding upper conductive layer 11U, the second spacer 14 may be formed to cover the upper portion of the sidewall of the pad 11B of the upper conductive layer 11U. Therefore, each of the second spacers 14 may be disposed to come into contact with the sidewall of the pad 11B of the upper conductive layer 11U and the upper surface of the pad 11B of the lower conductive layer 11L. Furthermore, the sidewall of the pad 11B of each conductive layer 11 may be completely covered by the first spacers 13 and the second spacers 14.

An upper surface of each of the second spacers 14 may be substantially disposed on the same level L1 as the upper surface of the pad 11B of the corresponding upper conductive layer 11U. In addition, a lower surface of each of the second spacers 14 may be disposed on the level L3 higher than a level L4 of a lower surface of the corresponding insulating layer 12 (L3>L4) and higher than the level L4 of a lower surface of the corresponding first spacer 13 (L3>L4).

The second spacers 14 may include material having a high etching selectivity to the insulating layers 12. For example, each of the insulating layer 12 may include an oxide, and each of the second spacer 14 may include a nitride. The second spacers 14 may include material having a high etching selectivity to the first spacers 13. For example, each of the second spacer 14 may include a nitride, and each of the first spacer 13 may include an oxide.

The contact plugs 15 are coupled with the respective pads 11B of the conductive layers 11. For instance, an interlayer insulating layer 16 is formed on the stack ST. Each of the contact plugs 15 passes through the interlayer insulating layer 16 and is coupled with the corresponding pad 11B. Since the thickness of each pad 11B is greater than that of the line 11A, the contact plugs 15 may be prevented from passing through the corresponding pads 11B. Due to a sufficient thickness of the corresponding pad 11B, a bridge may be prevented from being formed between the conductive layers 11.

According to the above-described configuration, the pad 11B of each of the conductive layers 11 has a thickness greater than that of the line 11A. Therefore, a distance D2 in the second direction II-II' between the pad 11B of the upper conductive layer 11U and the pad 11B of the lower conductive layer 11L is reduced. Instead, the distance D1 in the first direction I-I' between the pad 11B of the upper conductive layer 11U and the pad 11B of the lower conductive layer 11L is increased by the first spacer 13. As a result, an appropriate distance between the stacked pads 11B may be secured, and a bridge may be prevented from being formed.

Figure 2A:
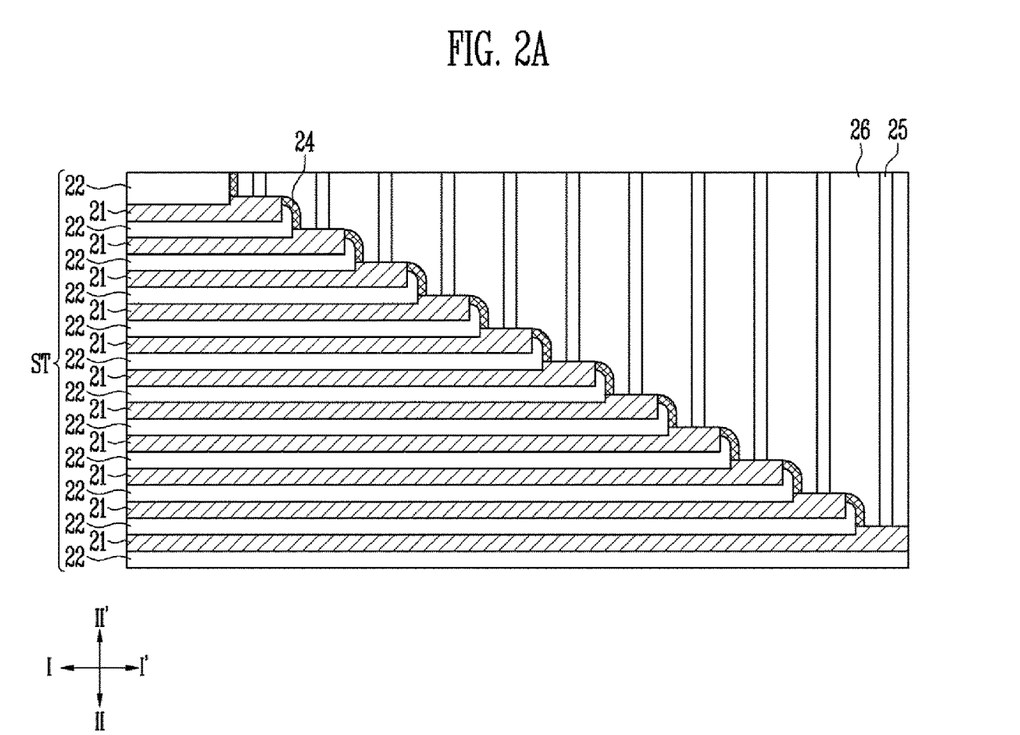
FIGS. 2A and 2B are sectional views illustrating a structure of a semiconductor device according to an embodiment of the present disclosure.
Figure 2B:
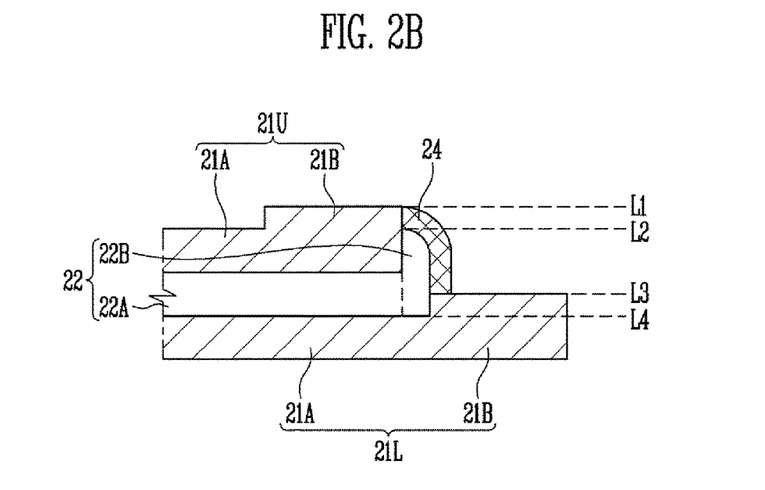

FIGS. 2A and 2B are sectional views illustrating a structure of a semiconductor device according to an embodiment of the present disclosure.

Referring to FIGS. 2A and 2B, the semiconductor device may include a stack ST including conductive layers 21 and insulating layers 22 that are alternately stacked, and contact plugs 25, which are coupled with the respective conductive layers 21. In addition, the semiconductor device may include spacers 24.

Each of the conductive layers 21 may include a line 21A and a pad 21B, which is electrically coupled with the line 21A. For instance, each of the conductive layer 21 includes a metal such as tungsten. The pad 21B has a thickness greater than that of the line 21A. The conductive layers 21 are stacked in a stepped form such that the pads 21B are exposed. Therefore, the stack ST has a stepped structure.

The insulating layers 22 are interposed between the stacked conductive layers 21. For example, each of the insulating layers 22 includes insulating material such as an oxide or a nitride. Each of the insulating layers 22 is disposed to cover the line 21A of a corresponding lower conductive layer 21L.

Each of the insulating layers 22 has a form, an end of which is bent upward to cover the pad 21B of a corresponding upper conductive layer 21U. For example, each of the insulating layers 22 includes a first region 22A, which is interposed between the upper conductive layer 21U and the lower conductive layer 21L, and a second region 22B, which is bent upward. The second region 22B may protrude between the pad 21B of the upper conductive layer 21U and the pad 21B of the lower conductive layer 21L.

An upper surface of the second region 22B may be disposed at a level L2 lower than a level L1 of an upper surface of the pad 21B of the upper conductive layer 21U and higher than a level L3 of an upper surface of the pad 21B of the lower conductive layer 21L (L3<L2<L1). In this case, a sidewall of the pad 21B of the upper conductive layer 21U may not be completely covered by the second region 22B. For example, the second region 22B of the insulating layer 22 may have a height suitable for covering a portion of the sidewall of the pad 21B of the upper conductive layer 11U.

The spacers 24 are disposed on the stepped structure of the stack ST. The spacers 24 may include material having a high etching selectivity to the insulating layers 22. For example, each of the insulating layers 22 may include an oxide, and each of the spacers 24 may include a nitride.

Each of the spacers 24 is formed to cover the bent end of the insulating layers 22. When the second region 22B of the insulating layer 22 exposes an upper portion of the sidewall of the pad 21B of the upper conductive layer 21U, the spacer 24 may be formed to cover the upper portion of the sidewall of the pad 21B of the upper conductive layer 21U. Therefore, each of the spacers 24 may be disposed to come into contact with the sidewall of the pad 21B of the upper conductive layer 21U and the upper surface of the pad 21B of the lower conductive layer 21L. Furthermore, the sidewall of the pad 21B of each of the conductive layer may be completely covered by the second region 22B of the corresponding insulating layer 22 and the associated spacer 24.

An upper surface of each of the spacers 24 may be substantially disposed on the same level L1 as the upper surface of the pad 21B of the corresponding conductive layer 21. In addition, a lower surface of each of the spacers 24 may be disposed on the level L3 higher than a level L4 of a lower surface of the corresponding insulating layer 22 (L4<L3).

The contact plugs 25 are coupled with the respective pads 21B of the conductive layers 21. For instance, an interlayer insulating layer 26 is formed on the stack ST. Each of the contact plugs 25 passes through the interlayer insulating layer 26 and is coupled with the corresponding pad 21B. Since the pad 21B has a thickness greater than that of the line 21A, the contact plugs 25 may be prevented from passing through the corresponding pads 21B. Due to a sufficient thickness of the corresponding pad 21B, a bridge may be prevented from being formed between the conductive layers 21.

FIGS. 3A to 3F are sectional views illustrating a method of manufacturing a semiconductor device according to an embodiment of the present disclosure.

Figure 3A:
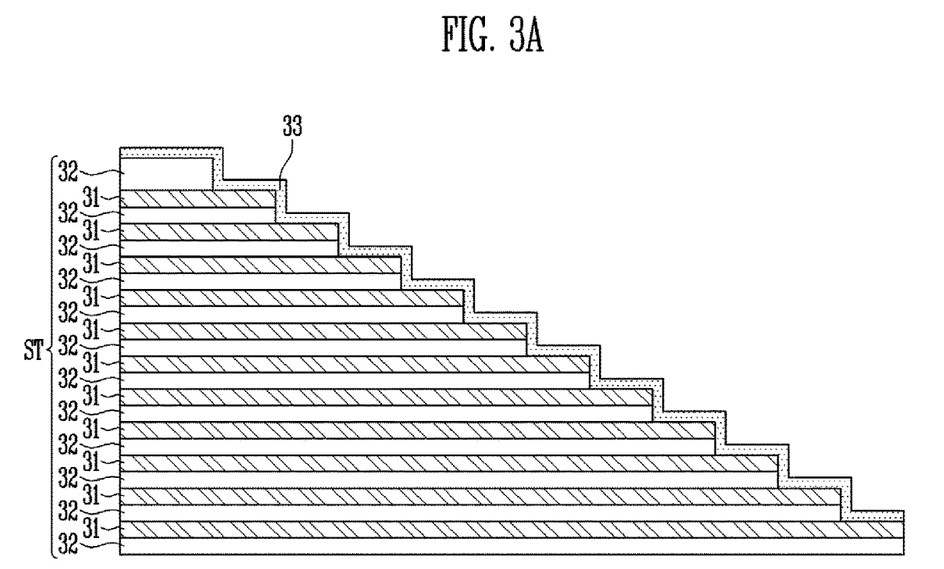
FIGS. 3A to 3F are sectional views illustrating a method of manufacturing a semiconductor device according to an embodiment of the present disclosure.

Referring to FIG. 3A, first material layers 31 and second material layers 32 are alternately formed. The first material layers 31 may be provided to form gate electrodes of memory cells, a select transistor, or the like, lines which are electrically respectively coupled with the gate electrodes, or pads which are electrically respectively coupled with the lines. Furthermore, the second material layers 32 may insulate the stacked gate electrodes, the lines, or the pads from each other.

Here, the first material layers 31 may include material having a high etching selectivity to the second material layers 32. For example, the first material layers 31 may be sacrificial layers including silicon or the like, and the second material layers 32 may be insulating layers including oxide or the like. In another embodiment, the first material layers 31 may be first sacrificial layers, and the second material layers 32 may be second sacrificial layers.

Thereafter, the first material layers 31 and the second material layers 32 are patterned to form a stepped structure such that the first material layers 31 are exposed. This forms a stack ST, which includes the first material layers 31 stacked in a stepped form and the second material layers 32 interposed between the first material layers 31. In other words, the stack ST having a stepped structure is formed. Each step of the stepped structure may include an upper first material layer 31 and a lower second material layer 32. An end of each of the first material layers 31, that is, a region to be formed into a pad, is exposed by the stepped structure.

For reference, although not shown in the drawings, a channel structure passing through the stack ST may be formed. For example, the stack ST includes a cell region in which memory cells are stacked, and a contact region in which an interconnection structure is disposed. The channel structure includes a channel layer passing through the stack ST, and a memory layer enclosing the channel layer. The memory layer may include a tunnel insulating layer, a data storing layer, and a charge blocking layer. The data storing layer may include a floating gate including silicon, charge trap material such as a nitride, phase change material, nanodots, and so forth.

Subsequently, a first spacer material layer 33 is formed on the stack ST having the stepped structure. The first spacer material layer 33 may be formed along the stepped structure of the stack ST. For instance, the first spacer material layer 33 is formed with a substantially uniform thickness, using a deposition method having excellent step coverage.

The first spacer material layer 33 includes material having a high etching selectivity to the first material layers 31. The first spacer material layer 33 may include an oxide, and the first material layers 31 may include silicon. For example, the first spacer material layer 33 may be an oxide layer, and each of the first material layers 31 may be a polysilicon layer.

Figure 3B:
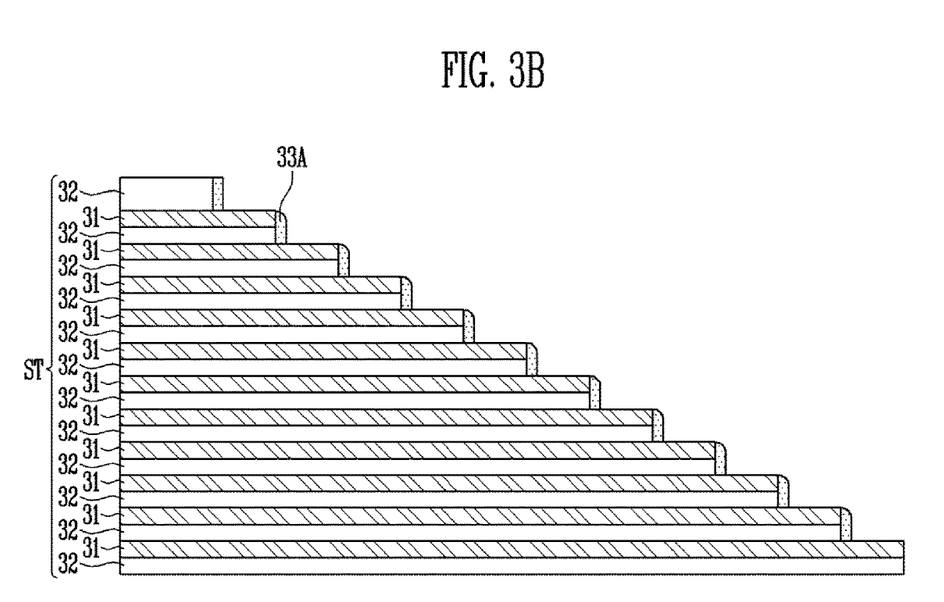

Referring to FIG. 3B, first spacers 33A are respectively formed on sidewalls of the first material layers 31 and the second material layers 32, both of which are exposed by the stepped structure. For instance, the first spacer material layer 33 is etched through an etchback process. In this case, regions of the first spacer material layer 33, which are formed on upper surfaces of the first material layers 31 are etched, while regions of the first spacer material layer 33, which are formed on the sidewalls of the first material layers 31 and on the sidewalls of the second material layers 32, remain. Consequently, a plurality of the first spacers 33A are formed.

The first spacers 33A are provided to secure distances between the pads to be formed through a following process. Therefore, the thickness of each of the first spacer 33A may be determined by taking into account a breakdown voltage between adjacent pads.

Figure 3C:
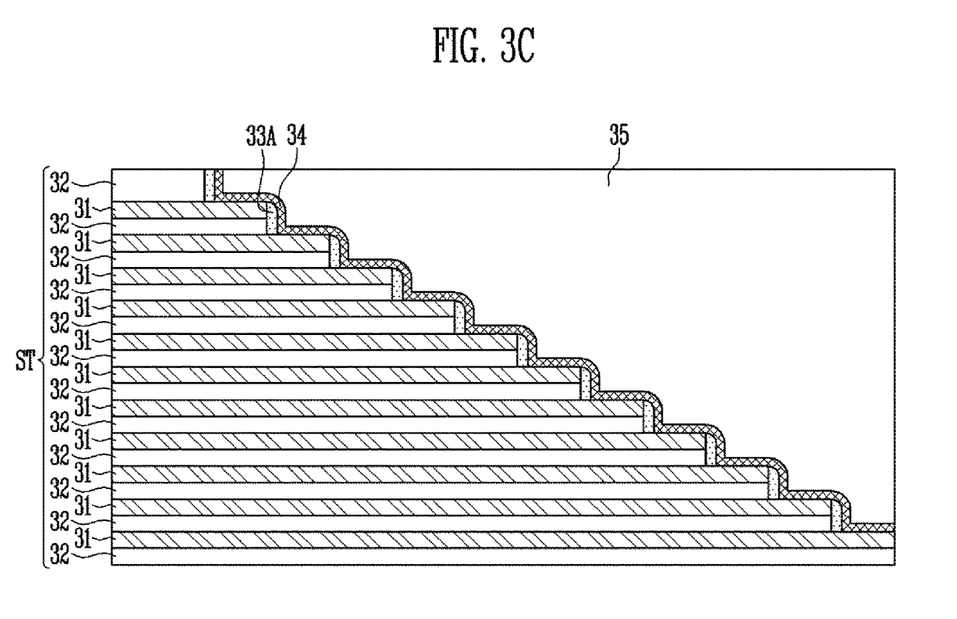

Referring to FIG. 3C, a second spacer material layer 34 is formed on the stack ST formed with the first spacers 33A. The second spacer material layer 34 may be formed along the stepped structure of the stack ST. For instance, the second spacer material layer 34 is formed with a substantially uniform thickness using a deposition method having an excellent step coverage. An example of the deposition method may include a low pressure-chemical vapor deposition (LP-CVD) method.

The second spacer material layer 34 includes material having a high etching selectivity to the first material layers 31. The second spacer material layer 34 may include a nitride, and the first material layers 31 may include a silicon. For example, the second spacer material layer 34 may be a nitride layer, and each of the first material layers 31 may be a polysilicon layer.

The second spacer material layer 34 includes material having a high etching selectivity to the first spacers 33A. The second spacer material layer 34 may include a nitride, and the first spacers 33A may include an oxide. For example, the second spacer material layer 34 may be a nitride layer, and each of the first spacers 33A may be an oxide layer.

Thereafter, an interlayer insulating layer 35 is formed on the stack ST formed with the second spacer material layer 34. For instance, an insulating layer is formed to cover the stack ST. Thereafter, the insulating layer is planarized until an upper surface of the stack ST is exposed. As a result, the interlayer insulating layer 35 is formed. A planarization process may be performed such that the second material layer 32 disposed on an uppermost portion of the stack ST is exposed. During this process, the second spacer material layer 34 formed on the upper surface of the stack ST may be removed.

The interlayer insulating layer 35 includes material having a high etching selectivity to the second spacer material layer 34. The interlayer insulating layer 35 may include an oxide, and the second spacer material layer 34 may include a nitride. For example, the interlayer insulating layer 35 may be an oxide layer, which is formed by a high density plasma-chemical vapor deposition (HDP-CVD) method.

Figure 3D:
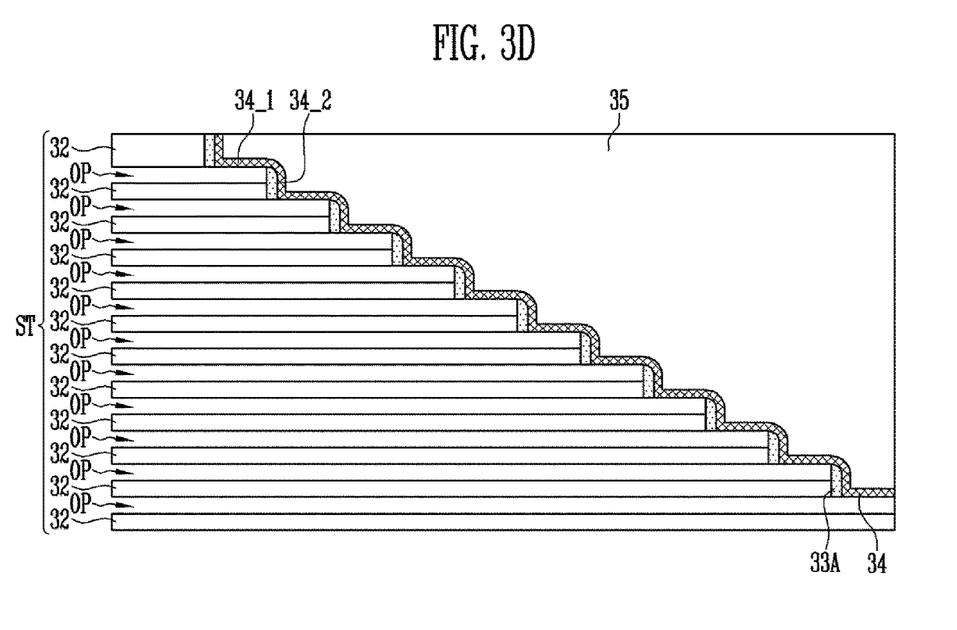

Referring to FIG. 3D, the first material layers 31 are selectively removed to form openings OP. For example, a slit passing through the stack ST is formed, and the first material layers 31 exposed through the slit are thereafter etched. An etching process may be performed under a condition of a high etching selectivity to the first material layers 31. When the first material layers 31 are polysilicon layers, the second material layers 32 are oxide layers, and the first spacers 33A are oxide layers, the first material layers 31 may be dipped out through a wet etching process using nitric acid. Therefore, the second material layers 32, the first spacers 33A, and the second spacer material layer 34 are not etched.

The second material layers 32, the first spacers 33A, and the second spacer material layer 34 are exposed through the openings OP. A portion of the second spacer material layer 34 may be protected by the first spacers 33A, so that the second spacer material layer 34 may be partially exposed through the openings OP. For example, regions 34_2 of the second spacer material layer 34, which are formed on the respective sidewalls of the first material layers 31 and the second material layers 32, are protected by the corresponding first spacers 33A. Regions 34_1 of the second spacer material layer 34, which are formed on the respective upper surfaces of the first material layer 31 and the second material layer 32, are exposed through the corresponding openings OP. In other words, the regions 34_1 of the second spacer material layer 34, which are formed in a horizontal direction, are exposed through the respective openings OP. Second regions 34_2 of the second spacer material layer 34, which are formed in a vertical direction, are not exposed.

Figure 3E:
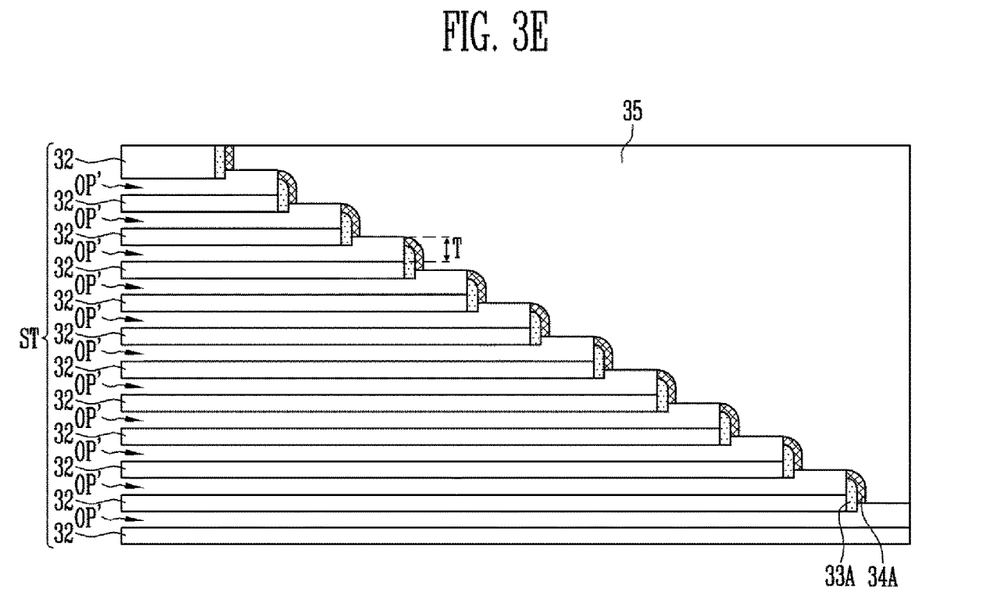

Referring to FIG. 3E, the second spacer material layer 34 (shown in FIG. 3D) exposed through the openings OP is selectively etched. Consequently, second spacers 34A covering the respective first spacers 33A are formed. For example, an etching process is performed under a condition of a high etching selectivity to the second spacer material layer 34. When the second spacer material layer 34 is a nitride layer, the second material layers 32 are oxide layers, and the first spacers 33A are oxide layers, the second spacer material layer 34 may be dipped out using phosphoric acid. Therefore, the second material layers 32 and the first spacers 33A are not etched.

When the second spacers 34A are formed, the second spacer material layer 34 (shown in FIG. 3D) is partially etched using the first spacers 33A as etch barriers. For instance, the first regions 34_1 (shown in FIG. 3D) of the second spacer material layer 34 (shown in FIG. 3D) that are formed in the horizontal direction are selectively etched. As a result, an end of each of the opening OP', that is, a region to be formed into a pad, is expanded in thickness.

Each of the first spacer 33A and the associated second spacer 34A are interposed between an end of corresponding upper opening OP' and an end of corresponding lower opening OP'. In other words, each of the first spacer 33A and the associated second spacer 34A separate a region of the corresponding upper opening OP', which is to be formed into a pad, from a region of the corresponding lower opening OP', which is to be formed into a pad. Therefore, during a process of expanding the ends of the openings OP', each upper opening OP' may be prevented from being coupled with the corresponding lower opening OP'.

Figure 3F:
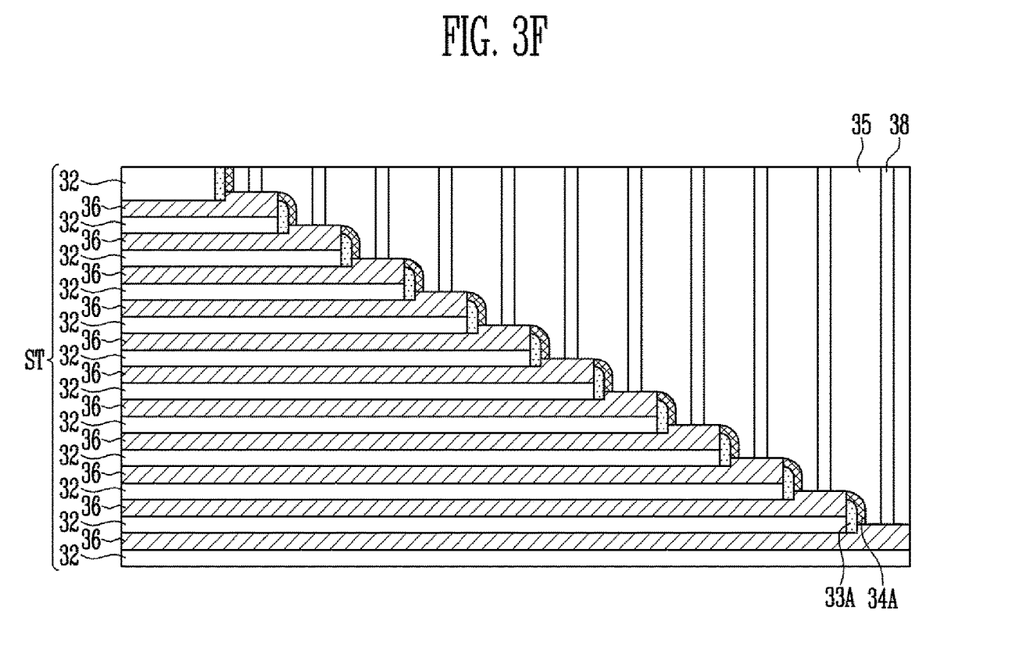

Referring to FIG. 3F, conductive layers 36 are formed in the respective openings OP' having the expanded ends (shown in FIG. 3E). Consequently, the conductive layers 36, which are stacked in a stepped form and expanded in thickness of the ends thereof, are formed. Regions of the conductive layers 36, which are covered by the upper second material layer 32, are lines. Regions of the conductive layers 36, which are exposed by the stepped structure and have increased thicknesses, may be pads. The lines electrically couple gate electrodes of stacked memory cells, a select transistor, or the like, with the pads.

An additional process may be performed depending on material characteristics of the second material layers 32. For example, when the first material layers 31 (shown in FIG. 3C) are first sacrificial layers and the second material layers 32 are second sacrificial layers, an additional process of replacing the second material layers 32 with insulating layers may be performed.

Subsequently, contact plugs 38 coupled with the respective pads of the conductive layers 36 are formed. For instance, holes, which pass through the interlayer insulating layer 35 and expose the respective pads of the conductive layers 36, are formed, and the contact plugs 38 are thereafter formed in the respective holes. Since each of the pads of the conductive layers 36 has a relatively large thickness, the pads may be prevented from being completely penetrated when the holes are formed.

Even when a second spacer 34A is exposed through the bottom of the corresponding hole by misalignment of the hole, the second spacer 34A functions as an etch stop layer. Therefore, the pad of the corresponding lower conductive layer 36 may be prevented from being exposed, thus, a bridge may be prevented from being formed.

According to the above-described process, since the second spacer material layer 34 (shown in FIG. 3D) is etched using the first spacers 33A as etch barriers, a portion of the second spacer material layer 34 remains between each of the upper opening OP' and the corresponding lower opening OP'. The distance between the end of the upper opening OP' and the lower opening OP' is secured by the corresponding first spacers 33A and the second spacers 34A. Therefore, a bridge may be prevented from being formed between the pad of each of the upper conductive layer 36 and the pad of the corresponding lower conductive layer 36.

Figure 4A:
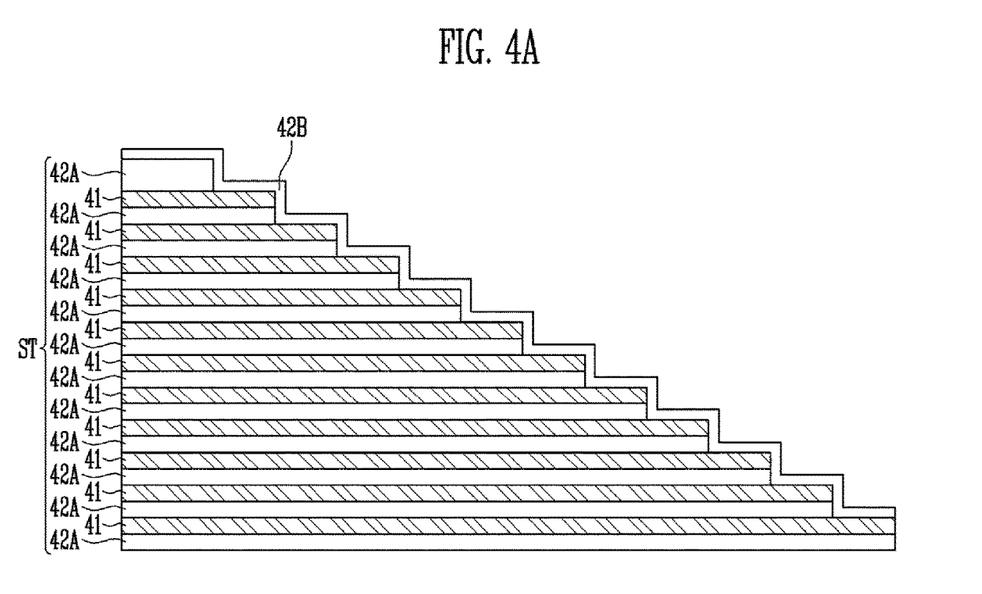
FIGS. 4A and 4B are sectional views illustrating a method of manufacturing a semiconductor device according to an embodiment of the present disclosure.
Figure 4B:
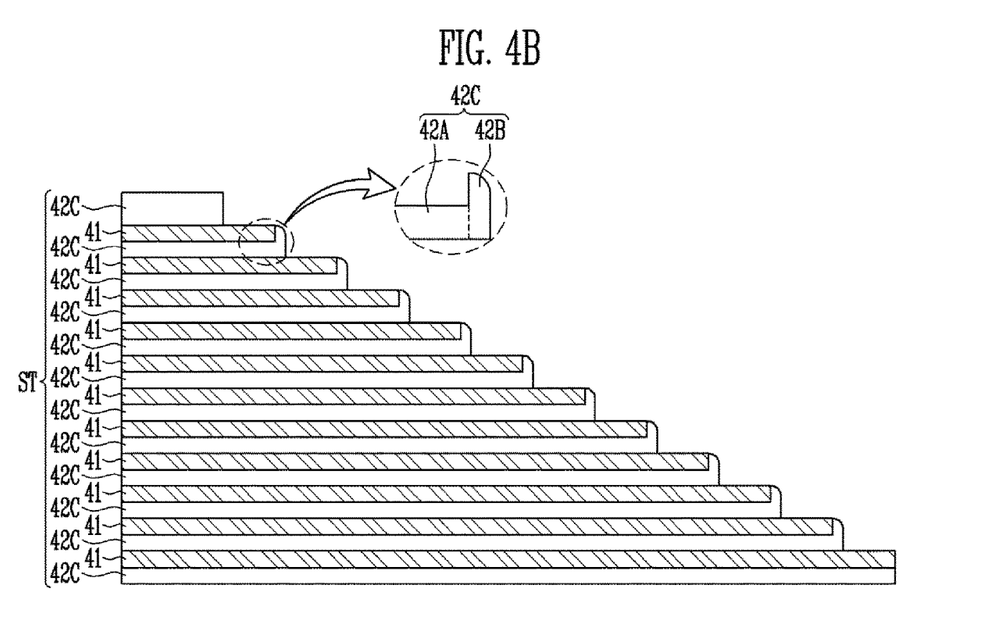

FIGS. 4A and 4B are sectional views illustrating a method of manufacturing a semiconductor device according to an embodiment of the present disclosure. Hereinbelow, repetitive explanation will be omitted if deemed redundant.

Referring to FIG. 4A, first material layers 41 and preliminary second material layers 42A are alternately formed. The first material layers 41 may include material having a high etching selectivity to the preliminary second material layers 42A. For example, the first material layers 41 may be a polysilicon layer, and the preliminary second material layers 42A may be an oxide layer.

Thereafter, the first material layers 41 and the preliminary second material layers 42A are patterned to form a stepped structure such that the first material layers 41 are exposed. Subsequently, an additional preliminary second material layer 42B is formed on the first material layers 41 and the preliminary second material layers 42A including a stepped structure. The additional preliminary second material layer 42B may include the same material as that of the preliminary second material layer 42A.

Referring to FIG. 4B, the additional preliminary second material layer 42B is etched back. Thereby, the preliminary second material layer 42B is patterned to form spacer-shaped preliminary second material layers 42B. Since the preliminary second material layers 42A may include the same material as that of the spacer-shaped preliminary second material layers 42B, each of the preliminary second material layer 42A and the corresponding spacer-shaped preliminary second material layer 42B, which is coupled with the preliminary second material layer 42A, form a single second material layer 42C. Through the above-described process, each of the second material layers 42C, an end of which is bent upward to cover a sidewall of a corresponding upper first material layer 41, may be formed.

A following process may be performed in a manner similar to that described above with reference to FIGS. 3C to 3F. Briefly, a third material layer (not shown) for a spacer is formed on the stack ST, and the first material layers are selectively etched through a slit so that the openings are formed. The third material layer includes material having a high etching selectivity to the first material layers 41. The third material layer may include a nitride, and the first material may include a silicon. For example, the third material layer may be a nitride layer, and each of the first material layers 41 may be a polysilicon layer. The third material layer includes material having a high etching selectivity to the second material layer 42C. The third material layer may include a nitride, and the second material layer 42C may include an oxide.

Thereafter, the third material layer exposed through the openings is selectively and partially etched. This forms spacers, which cover the respective bent ends of the second material layers 42C. Subsequently, conductive layers are formed in the openings.

According to above-described process, since each of the second material layers 42C includes a bent end, the third material layer may be partially etched. Therefore, a pad of each of the upper conductive layer and a pad of a corresponding lower conductive layer may be separated from each other by the bent end of the corresponding second material layers 42C and the corresponding spacer.

Figure 5:
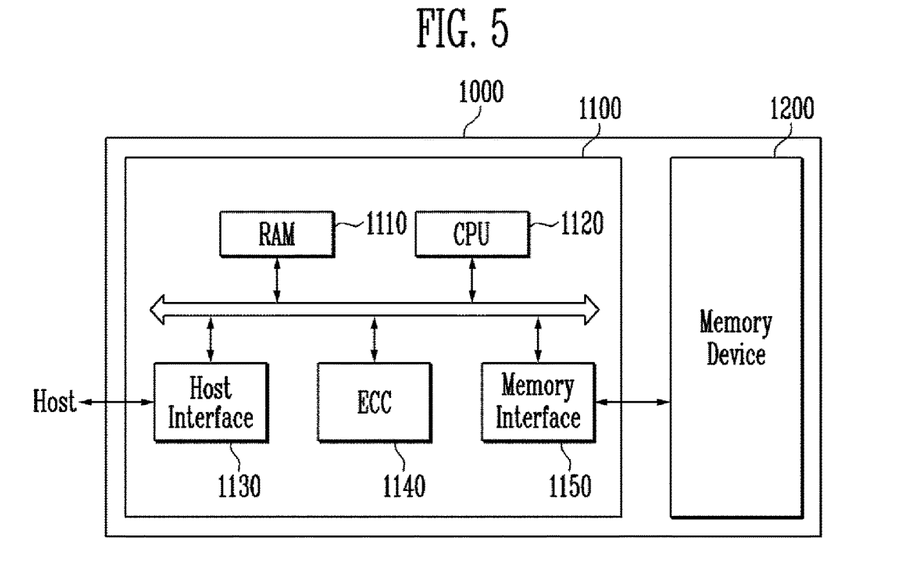
FIGS. 5 and 6 are block diagrams illustrating a memory system according to an embodiment of the present disclosure.

FIG. 5 is a block diagram showing a memory system 1000 according to an embodiment of the present disclosure.

Referring to FIG. 5, the memory system 1000, according to the embodiment of the present disclosure, includes a memory device 1200 and a controller 1100.

The memory device 1200 is used to store data information having a variety of data forms such as text, graphics, and software codes. The memory device 1200 may be a non-volatile memory. Furthermore, the memory device 1200 may have the structure described above with reference to FIGS. 1A to 4B, and may be manufactured by the manufacturing method described above with reference to FIGS. 1A to 4B.

In an embodiment, the memory device 1200 may include conductive layers each including a line and a pad, which is coupled with the line and has a thickness greater than that of the line, the conductive layers being stacked in a stepped form such that the pads are exposed; insulating layers interposed between the conductive layers; first spacers, each of which is interposed between the pad of the corresponding upper conductive layer and the pad of the corresponding low conductive layer, and covering a sidewall of the corresponding insulating layer; and second spacers covering the respective first spacers. The structure of the memory device 1200 and the manufacturing method thereof are the same as those described above; therefore, detailed explanation thereof will be omitted.

The controller 1100 may be coupled to a host Host and the memory device 1200. The controller 1100 may access the memory device 1200 in response to a request from the host Host. For example, the controller 1100 may control read, write, erase, and background operations of the memory device 1200.

The controller 1100 includes a random access memory (RAM) 1110, a central processing unit (CPU) 1120, a host interface 1130, an error correction code (ECC) circuit 1140, and a memory interface 1150.

The RAM 1110 is used as an operation memory of the CPU 1120, a cache memory between the memory device 1200 and the host Host, a buffer memory between the memory device 1200 and the host Host, and so forth. For reference, the RAM 1110 may be replaced with a static random access memory (SRAM), a read only memory (ROM), or the like.

The CPU 1120 may control the overall operation of the controller 1100. For example, the CPU 1120 may operate firmware such as a flash translation layer (FTL) stored in the RAM 1110.

The host interface 1130 may interface with the host Host. For example, the controller 1100 may communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The ECC circuit 1140 may use an error correction code (ECC) to detect and correct errors in data read from the memory device 1200.

The memory interface 1150 may interface with the memory device 1200. For example, the memory interface 1150 may include a NAND interface or a NOR interface.

For reference, the controller 1100 may further include a buffer memory (not shown) for temporarily storing data. The buffer memory may be used to temporarily store data to be transferred from the host interface 1130 to an external device, or data to be transferred from the memory interface 1150 to the memory device 1200. In addition, the controller 1100 may include a ROM that stores code data for interfacing with the host Host.

Since the memory system 1000 according to the embodiment of the present invention includes the memory device 1200 having improved integration and characteristics, the integration and characteristics of the memory system 1000 may also be improved.

Figure 6:
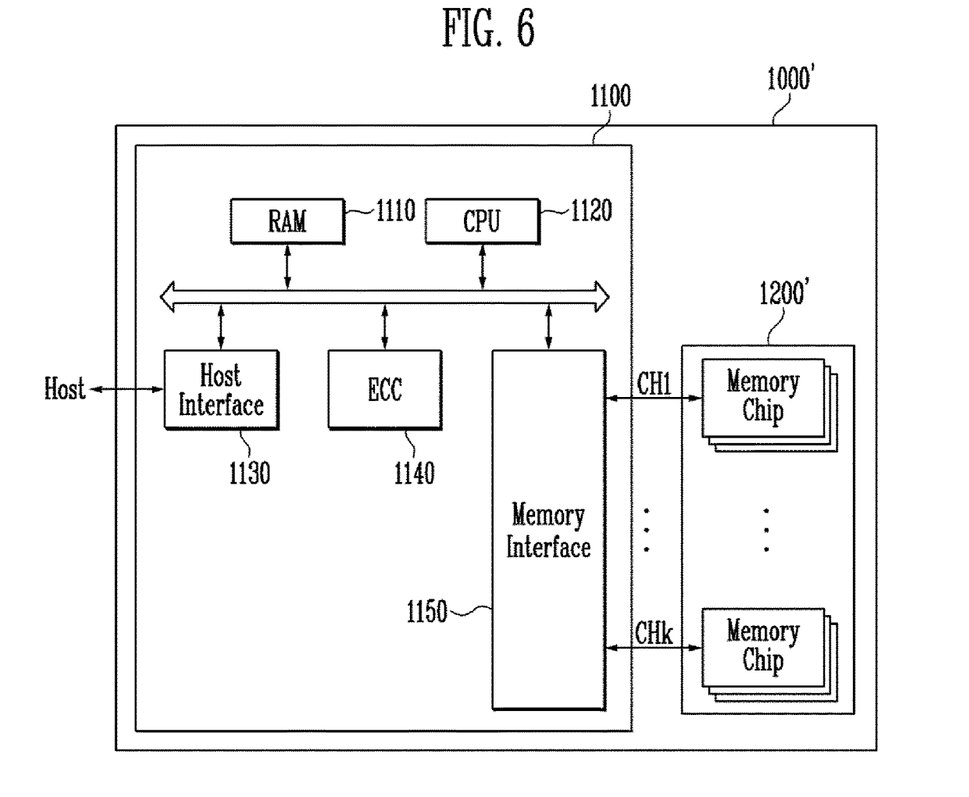

FIG. 6 is a block diagram showing a configuration of a memory system according to an embodiment of the present disclosure. Hereinbelow, repetitive explanation will be omitted if deemed redundant.

Referring to FIG. 6, a memory system 1000' according to the embodiment of the present disclosure may include a memory device 1200' and a controller 1100. The controller 1100 includes a RAM 1110, a CPU 120, a host interface 1130, an ECC circuit 1140, a memory interface 1150, and so on.

The memory device 1200' may be a nonvolatile memory. Furthermore, the memory device 1200' may have the structure described above with reference to FIGS. 1A to 4B, and may be manufactured by the manufacturing method described above with reference to FIGS. 1A to 4B. In an embodiment, the memory device 1200' may include conductive layers each including a line and a pad, which is coupled with the line and has a thickness greater than that of the line, the conductive layers being stacked in a stepped form such that the pads are exposed; insulating layers interposed between the conductive layers; first spacers each of which is interposed between the pad of the corresponding upper conductive layer and the pad of the corresponding low conductive layer and covering a sidewall of the corresponding insulating layer; and second spacers covering the respective first spacers. The structure of the memory device 1200' and the manufacturing method thereof are the same as those described above; therefore detailed explanation thereof will be omitted.

Furthermore, the memory device 1200' may be a multi-chip package including a plurality of memory chips. The plurality of memory chips are divided into a plurality of groups. The plurality of groups may communicate with the controller 1100 through first to k-th channels CH1 to CHk. The memory chips of each group communicate with the controller 1100 through a common channel. For reference, the memory system 1000' may be modified such that each single memory chip is coupled to a corresponding single channel.

As described above, since the memory system 1000' according to the embodiment of the present invention includes the memory device 1200' having improved integration and characteristics, the integration and characteristics of the memory system 1000' may also be improved. In particular, the memory device 1200' according to the embodiment of the present invention is formed of a multi-chip package, whereby the data storage capacity and the operating speed can be enhanced.

Figure 7:
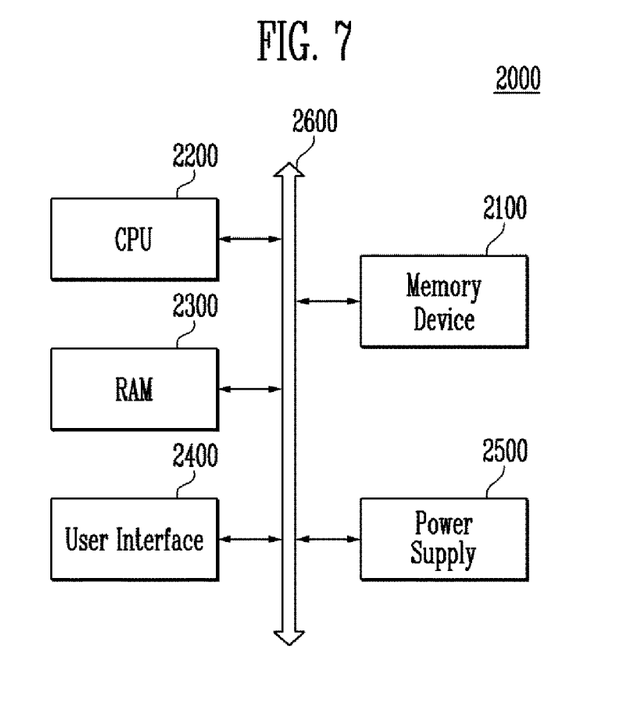
FIGS. 7 and 8 are block diagrams showing a computing system according to an embodiment of the present disclosure.

FIG. 7 is a block diagram showing a configuration of a computing system according to an embodiment of the present disclosure. Hereinbelow, repetitive explanation will be omitted if deemed redundant.

Referring to FIG. 7, the computing system 2000 according to the embodiment of the present disclosure includes a memory device 2100, a CPU 2200, a RAM 2300, a user interface 2400, a power supply 2500, a system bus 2600, and so forth.

The memory device 2100 stores data provided via the user interface 2400, data processed by the CPU 2200, etc. Furthermore, the memory device 2100 is electrically coupled to the CPU 2200, the RAM 2300, the user interface 2400, the power supply 2500, etc. by the system bus 2600. For example, the memory device 2100 may be coupled to the system bus 2600 via a controller (not shown) or, alternatively, may be directly coupled to the system bus 2600. When the memory device 2100 is directly coupled to the system bus 2600, the function of the controller may be performed by the CPU 2200, the RAM 2300, etc.

The memory device 2100 may be a nonvolatile memory. Furthermore, the memory device 2100 may have the structure described above with reference to FIGS. 1A to 4B, and may be manufactured by the manufacturing method described above with reference to FIGS. 1A to 4B. In an embodiment, the memory device 2100 may include conductive layers each including a line and a pad, which is coupled with the line, and has a thickness greater than that of the line, the conductive layers being stacked in a stepped form such that the pads are exposed; insulating layers interposed between the conductive layers; first spacers each of which is interposed between the pad of the corresponding upper conductive layer and the pad of the corresponding low conductive layer and covering a sidewall of the corresponding insulating layer; and second spacers covering the respective first spacers. The structure of the memory device 2100 and the manufacturing method thereof are the same as those described above; therefore, detailed explanation thereof will be omitted.

As described above with reference to FIG. 6, the memory device 2100 may be a multi-chip package configured with a plurality of memory chips.

The computing system 2000 having the above-mentioned configuration may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, or the like.

As described above, since the computing system 2000 according to the embodiment includes the memory device 2100 having improved integration and characteristics, the characteristics of the computing system 2000 may also be improved.

Figure 8:
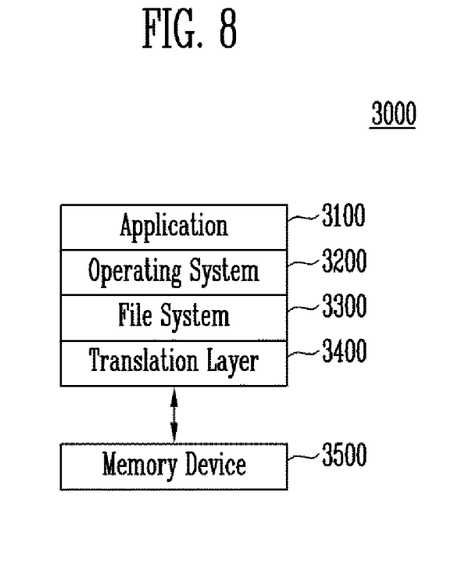

FIG. 8 is a block diagram illustrating a computing system according to an embodiment of the present disclosure.

Referring to FIG. 8, the computing system 3000 according to the embodiment of the present disclosure may include a software layer, which has an operating system 3200, an application 3100, a file system 3300, a translation layer 3400, and so forth. Furthermore, the computing system 3000 includes a hardware layer such as a memory device 3500.

The operating system 3200 manages software resources and hardware resources, etc. of the computing system 3000 and may control program execution by the CPU (shown in FIG. 7). The application 3100 may be various application programs executed in the computing system 3000 and may be a utility executed by the operating system 3200.

The file system 3300 refers to a logical structure for controlling data, files, etc. that are present in the computing system 3000 and organizes files or data to be stored in the memory device 3500 or the like according to a given rule. The file system 3300 may be determined depending on the operating system 3200 used in the computing system 3000. For example, if the operating system 3200 is Microsoft's Windows system, the file system 3300 may be a file allocation table (FAT), an NT file system (NTFS), or the like. If the operating system 3200 is a Unix/Linux system, the file system 3300 may be an extended file system (EXT), a Unix file system (UFS), a journaling file system (JFS), or the like.

Although the operating system 3200, the application 3100, and the file system 3300 are expressed by separate blocks in the drawing, the application 3100 and the file system 3300 may be included in the operating system 3200.

The translation layer 3400 translates an address into a suitable form for the memory device 3500 in response to a request from the file system 3300. For example, the translation layer 3400 translates a logical address produced by the file system 3300 into a physical address of the memory device 3500. Mapping information of the logical address and the physical address may be stored in an address translation table. For example, the translation layer 3400 may be a flash translation layer (FTL), a universal flash storage link layer (ULL), or the like.

The memory device 3500 may be a nonvolatile memory. Furthermore, the memory device 3500 may have the structure described above with reference to FIGS. 1A to 4B, and may be manufactured by the manufacturing method described above with reference to FIGS. 1A to 4B. In an embodiment, the memory device 3500 may include conductive layers each including a line and a pad, which is coupled with the line and has a thickness greater than that of the line, the conductive layers being stacked in a stepped form such that the pads are exposed; insulating layers interposed between the conductive layers; first spacers each of which is interposed between the pad of the corresponding upper conductive layer and the pad of the corresponding low conductive layer and covering a sidewall of the corresponding insulating layer; and second spacers covering the respective first spacers. The structure of the memory device 3500 and the manufacturing method thereof are the same as those described above; therefore, detailed explanation thereof will be omitted.

The computing system 3000 having the above-mentioned configuration may be divided into an operating system layer implemented in an upper level region and a controller layer implemented in a lower level region. The application 3100, the operating system 3200, and the file system 3300 may be included in the operating system layer, and may be driven by an operating memory of the computing system 3000. The translation layer 3400 may be included in the operating system layer or the controller layer.

As described above, since the computing system 3000 according to the embodiment of the present invention includes the memory device 3500 having improved integration and characteristics, the characteristics of the computing system 3000 may also be improved.

The present disclosure may provide a semiconductor device having a stable structure and improved reliability. In manufacturing the semiconductor device, the manufacturing process may be facilitated, and a procedure thereof may be simplified, and the manufacturing cost may be reduced.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor device comprising:
   conductive layers each comprising a line, and a pad, which is coupled with the line and has a thickness greater than a thickness of the line, the conductive layers being stacked such that a pad of a lower conductive layer is exposed by an upper conductive layer;
   insulating layers interposed between the respective conductive layers;
   first spacers each interposed between a pad of the upper conductive layer and the pad of the lower conductive layer;
   second spacers covering the respective first spacers; and
   an interlayer insulating layer in direct contact with the second spacers.

2. The semiconductor device according to claim 1, wherein each of the first spacers covers a sidewall of a corresponding insulating layer.

3. The semiconductor device according to claim 2, wherein the pad of the upper conductive layer and the pad of the lower conductive layer are spaced apart from each other by a thickness of a corresponding first spacer.

4. The semiconductor device according to claim 2, wherein a gap is present between each of the insulating layers and the pad of the lower conductive layer, and the gap is filled by a corresponding first spacer.

5. The semiconductor device according to claim 2, wherein each of the second spacers comes into contact with a sidewall of the pad of the upper conductive layer and an upper surface of the pad of the lower conductive layer.

6. The semiconductor device according to claim 2, wherein a lower surface of each of the second spacers is disposed on a level higher than a lower surface of a corresponding insulating layer.

7. The semiconductor device according to claim 2, wherein each of the second spacers includes material having a high etching selectivity to the insulating layers and the corresponding first spacer.

8. The semiconductor device according to claim 2, wherein each of the insulating layers or each of the first spacers includes an oxide material, and each of the second spacers includes a nitride material.

9. A semiconductor device comprising:
   conductive layers each comprising a line, and a pad, which is coupled with the line and has a thickness greater than a thickness of the line, the conductive layers being stacked such that a pad of a lower conductive layer is exposed by an upper conductive layer;
   insulating layers interposed between the conductive layers, each of the insulating layers having a shape, an end of which is bent upward to cover a pad of the upper conductive layer;
   spacers covering respective ends of the insulating layers; and
   contact plugs coupled with respective pads of the conductive layers.

10. The semiconductor device according to claim 9, wherein each of the spacers comes into contact with a sidewall of the pad of the upper conductive layer and an upper surface of the pad of the lower conductive layer.

11. The semiconductor device according to claim 9, wherein a lower surface of each of the insulating layers is disposed on a level lower than a lower surface of a corresponding spacer.

12. The semiconductor device according to claim 9, wherein each of the spacers includes material having a high etching selectivity to the insulating layers.

13. The semiconductor device according to claim 9, wherein each of the insulating layers includes an oxide material, and each of the spacers includes a nitride material.

14. The semiconductor device according to claim 1, further comprising contact plugs coupled with respective pads of the conductive layers.

15. The semiconductor device according to claim 9, further comprising an interlayer insulating layer formed on the conductive layers and the insulating layers, wherein the contact plugs pass through the interlayer insulating layer.

16. A semiconductor device comprising:
   conductive layers each comprising a line, and a pad, which is coupled with the line and has a thickness greater than a thickness of the line, the conductive layers being stacked such that a pad of a lower conductive layer is exposed by an upper conductive layer;
   insulating layers interposed between the respective conductive layers;
   first spacers each interposed between a pad of the upper conductive layer and the pad of the lower conductive layer; and
   second spacers covering the respective first spacers,
   wherein the pad of the upper conductive layer and the pad of the lower conductive layer are spaced apart from each other by a thickness of a corresponding first spacer.

* * * * *